United States Patent [19]

Overweg et al.

[11] Patent Number: 5,426,366
[45] Date of Patent: Jun. 20, 1995

[54] MAGNETIC RESONANCE APPARATUS COMPRISING A SUPERCONDUCTING MAGNET

[75] Inventors: Johannes A. Overweg, Bergisch Gladbach, Germany; Gerardus B. J. Mulder, Eindhoven, Netherlands

[73] Assignee: U.S. Philips Corporation, New York, N.Y.

[21] Appl. No.: 161,949

[22] Filed: Dec. 2, 1993

[30] Foreign Application Priority Data

Dec. 11, 1992 [EP] European Pat. Off. ............ 92203836

[51] Int. Cl.⁶ .............................................. G01R 33/20
[52] U.S. Cl. .................................... 324/319; 324/318; 324/322
[58] Field of Search .................. 335/216, 299, 301; 324/318, 319, 322, 300

[56] References Cited

U.S. PATENT DOCUMENTS

| | | | |
|---|---|---|---|
| 4,680,666 | 7/1987 | Rios | 335/301 |
| 4,926,289 | 5/1990 | Reichert | 324/319 |
| 5,045,826 | 9/1991 | Laskaris | 324/318 |
| 5,084,677 | 1/1992 | McDougall | 324/322 |
| 5,235,282 | 8/1993 | Overweg et al. | 324/318 |
| 5,245,306 | 9/1993 | Overweg | 324/319 |
| 5,276,399 | 1/1994 | Kasten et al. | 324/319 |
| 5,329,266 | 7/1994 | Soeldner et al. | 324/319 |

FOREIGN PATENT DOCUMENTS 0138270 4/1985 European Pat. Off. .
0299325 1/1989 European Pat. Off. .

Primary Examiner—Sandra L. O'Shea
Assistant Examiner—Raymond Y. Mah
Attorney, Agent, or Firm—Edward Blocker

[57] ABSTRACT

The apparatus comprises a magnet system which is rotationally symmetrically arranged about a central axis (9) and which comprises a superconducting inner coil system (1) for generating a steady magnetic field in a measurement space (5) within the magnet system, and also comprises an outer coil system (7) which is arranged so as to be coaxial with the inner coil system and which is electrically connected in series therewith in order to shield the environment from the magnetic field generated by the inner coil system. The magnet system can be bridged by of a superconducting persistent current switch (33) and comprises a superconducting shunt (37) which bridges a pan of the magnet system which is situated between first and second connection points (39, 41). In order to improve the shielding of the measurement space (5) from the effects of external magnetic fields, at least one turn of a coil (17) forming part of the magnet system is situated between at least one of the connection points (39, 41) and the nearest end of the inner coil system (1). The shielding effect can be further enhanced by utilizing more than one shunt (37, 53).

13 Claims, 3 Drawing Sheets

MAGNETIC RESONANCE APPARATUS COMPRISING A SUPERCONDUCTING MAGNET

BACKGROUND OF THE INVENTION

The invention relates to a magnetic resonance apparatus, comprising a magnet system which is rotationally symmetrically arranged about a central axis and which comprises a superconducting inner coil system for generating a steady magnetic field in a measurement space within the magnet system, and also comprises an outer coil system which is arranged so as to be coaxial with the inner coil system and which is electrically connected in series therewith in order to shield the environment from the magnetic field generated by the inner coil system, which magnet system can be bridged by a superconducting persistent current switch and comprises a superconducting shunt which bridges a part of the magnet system which is situated between first and second connection points.

An apparatus of this kind is known from EP-B-0 299 325. In the known apparatus the shunt extends between the points where the inner coil system is connected to the outer coil system. The shunt thus allows for different currents to flow in the inner coil system and the outer coil system, so that the effect of external magnetic field variations on the magnetic field at the centre of the measurement zone is reduced. It has been found in practice, however, that in this manner rather incomplete shielding from the effects of external magnetic fields is achieved: in the measurement space a uniform external magnetic field is attenuated to approximately 15% of the original value. Shielding from non-uniform external magnetic fields is even less complete.

SUMMARY OF THE INVENTION

It is an object of the invention to provide a magnetic resonance apparatus of the kind set forth in which substantially complete shielding from the effects of uniform as well as non-uniform external magnetic fields on the magnetic field in at least the central part of the measurement space is achieved. To this end, the device in accordance with the invention is characterized in that at least one turn of a coil forming part of the magnet system is situated between at least one of the connection points and the nearest end of the inner coil system.

The invention is based on the recognition of the fact that the shunt need not necessarily extend between the ends of the inner coil system. By choosing the connection points to be situated at a distance of some turns from these ends, an additional degree of freedom is introduced which enables optimum shielding to be achieved.

It has been found that notably the effect of uniform external magnetic fields can be shielded best by means of a shunt extending between connection points which are symmetrically situated within the magnet system. Therefore, a first preferred embodiment of the device in accordance with the invention is characterized in that between a first end of the inner coil system and the first connection point the same number of turns of a coil forming part of the magnet system is situated as between a second end of the inner coil system and the second connection point.

Attractive results are obtained when the shunt bridges only a part of the inner coil system. Therefore, a further preferred embodiment of the device in accordance with the invention is characterized in that the turns between the first and the second connection point and the first and the second end, respectively, of the inner coil system form part of coils of the inner coil system. Excellent shielding from uniform external magnetic fields is thus achieved if the locations of the first and second connection points are chosen so that the relation:

$$0.95 < A_p \frac{K_p(L_s + M_{ps}) - K_s(L_p + M_{ps})}{L_p \cdot L_s - M_{ps}^2} < 1.05$$

is satisfied, in which the index p relates to the part of the inner coil system which is to be referred to as the primary circuit and which is bridged by the shunt, and the index s relates to the remaining parts of the inner coil system plus the outer coil system, together referred to as the secondary circuit, in which $K_p$ and $K_s$ are the coil constants of the primary circuit and the secondary circuit, respectively, $L_p$ and $L_s$ are, the self-inductance of the primary and the secondary circuit, respectively, $M_{ps}$ is the mutual inductance between these circuits, and $A_p$ is the total surface area of all turns in the primary circuit.

In many magnetic resonance apparatuses the inner coil system comprises a number of coil pairs which are symmetrically arranged relative to a central plane extending perpendicularly to the central axis. It has been found that in such cases attractive results are obtained when the first and second connection points are situated at such a location within the coils of the outer coil pair of the inner coil system that the number of turns between each of the connection points and the end of the relevant coil which is situated furthest outwards amounts to approximately 25% of the number of turns of said coil.

The number of degrees of freedom in the design of the magnet system, and hence the number of possibilities of further optimizing the shielding from external magnetic fields, can be further increased when the magnet system comprises at least one second shunt which bridges a part of the magnet system which is situated between third and fourth connection points. A first version of this embodiment is characterized in that the third and fourth connection points are situated at the first and second ends, respectively, of the inner coil system. A second version, in which a high degree of symmetry is achieved, is characterized in that equal numbers of turns of coils forming part of the inner coil system are situated between the first and third connection points and between the second and fourth connection points. A third version, in which parts of the inner coil system which are symmetrically situated relative to the centre are bridged by the shunts, is characterized in that equal numbers of turns of coils forming part of the magnet system are situated between the first connection point and the first end of the inner coil system and between the fourth connection point and the second end of the inner coil system, and that also between the second connection point and the first end of the inner coil system and between the third connection point and the second end of the inner coil system equal numbers of turns of coils forming pan of the magnet system are situated.

The number of degrees of freedom can be further increased when more than two shunts are provided. In a magnet system in which the inner coil system consists of a number of coils which are arranged one behind the other in the axial direction, each coil of the inner coil system is preferably bridged by a shunt, and in a magnet system in which the outer coil system consists of a number of coils which are arranged one behind the other in the axial direction, each coil of the outer coil system may be bridged by a shunt.

Generally speaking, the magnetic field generated by the inner coil system is subject to a given drift whereby a given current can be induced in the shunt. In order to ensure that this current has disappeared again after a few hours, a preferred embodiment of the device in accordance with the invention is characterized in that a resistance of an order of magnitude of 1 mΩ is included in the circuit formed by each of the shunts and the associated connection points.

BRIEF DESCRIPTION OF THE DRAWINGS

These and other aspects of the invention will be described in detail hereinafter with reference to the drawing.

DETAILED DESCRIPTION OF THE PREFERRED EMBODIMENTS

Figure 1:
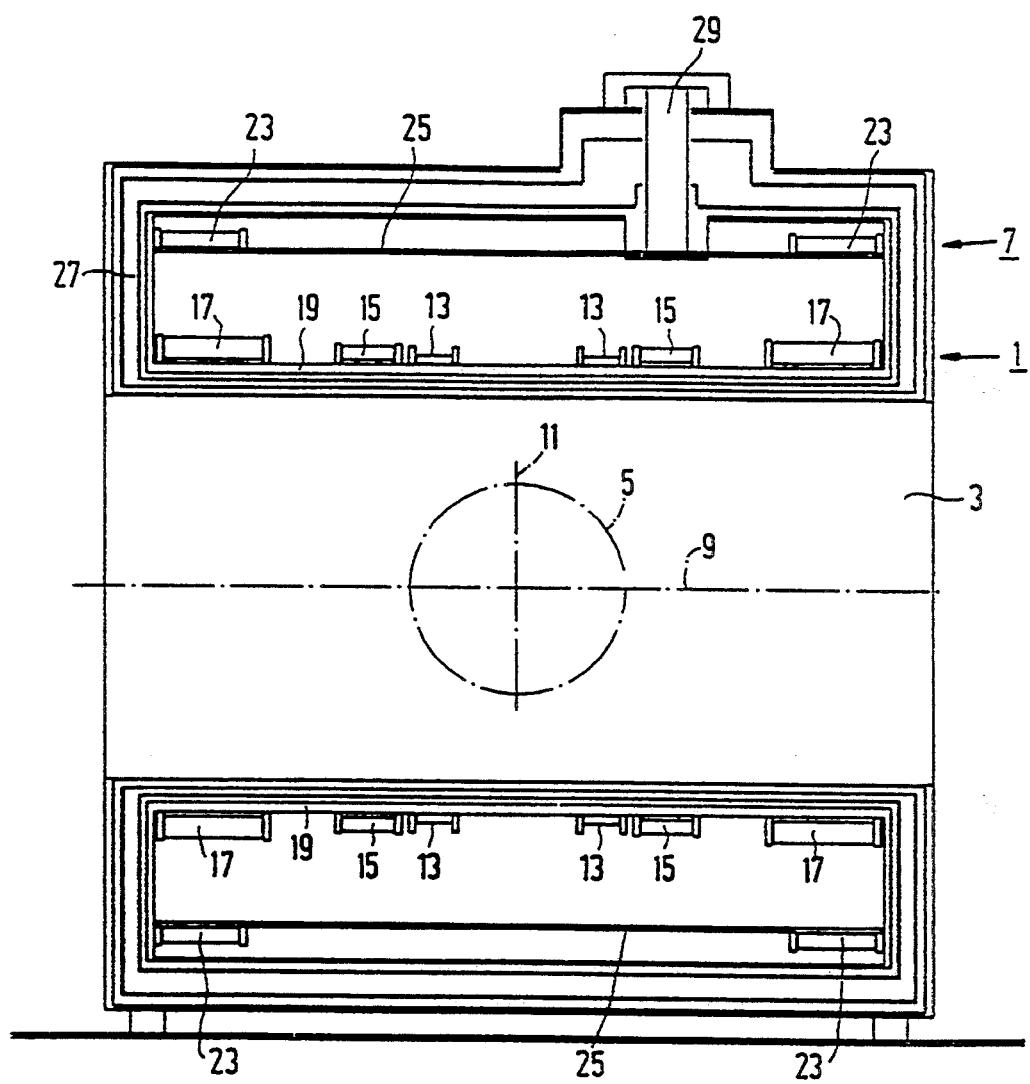
FIG. 1 is a longitudinal sectional view of a magnet system suitable for use in a magnetic resonance apparatus in accordance with the invention.

The magnet system shown in FIG. 1 may form part of a magnetic resonance apparatus, for example as described in EP-A-138 270. It comprises an approximately cylindrical electromagnetic inner coil system 1 which encloses a receiving space 3 which also has an approximately cylindrical shape and an approximately spherical central part of which, denoted by a dot-dash line, acts as a measurement space 5. A patient (not shown) can be introduced into the receiving space 3 having a diameter of, for example 100 cm, so that a part of the body of the patient to be examined is situated within the measurement space 5 having a diameter of, for example approximately 45 cm. The inner coil system 1 serves to generate a substantially uniform, steady magnetic field in the measurement space 5. The inner coil system 1 is concentrically enclosed by an approximately cylindrical outer coil system 7. The two coil systems 1, 7 and the receiving space 3 are rotationally symmetrical relative to a central axis 9, denoted by a dot-dash line, and are often (but not necessarily) symmetrical relative to a central plane which extends perpendicularly to the central axis and which is denoted by a dot-dash line 11.

The inner coil system 1 of the present embodiment comprises a pair of inner coils 13, a pair of central coils 15, and a pair of outer coils 17. Said coil pairs 13, 15, 17 are symmetrically situated relative to the symmetry plane 11, i.e. the coils of the same pair which are situated to both sides of the symmetry plane comprise the same numbers of turns and are the mirror image of one another in respect of shape and distribution of the turns. The coils 13, 15, 17 of the inner coil system 1 are provided on a first common support 19. The outer coil system 7 comprises a pair of coils 23 which are also symmetrical with respect to the symmetry plane 11. The coils 23 of the outer coil system 7 are accommodated on a second common support 25.

The two coil systems 1, 7 are accommodated in a dewar vessel 27 which can be filled with a suitable cooling liquid, for example liquid helium, via an inlet 29. The coils constituting the coil systems 1, 7 are made of a material which is superconducting at the temperature of the cooling liquid.

Figure 2:
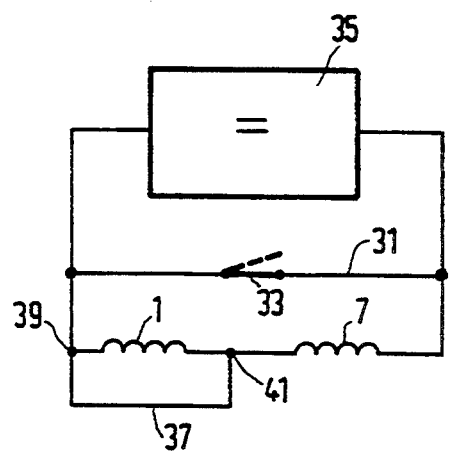
FIG. 2 shows a circuit diagram of a known magnet system comprising a shunt.

FIG. 2 shows a circuit diagram of an embodiment of an electric circuit in which the coil systems 1, 7 are included. This circuit is known from EP-B-0 299 325. The coil systems 1, 7 are connected in series via a superconducting connection 31 in which there is included a persistent current switch (PCS) 33 which normally is also superconducting. The coil systems 1, 7 are also connected to a DC power supply apparatus 35 for supplying the coil systems with electric energy. To this end, the PCS 33 is adjusted to a non-superconducting state (for example, by heating), after which electric current can flow from the power supply apparatus 35 to the superconducting coil systems 1, 7. When the current in the coil systems 1, 7 reaches a predetermined value, the PCS 33 is adjusted to the superconducting state again. A persistent current then continues to flow through the closed circuit formed by the coil systems 1, 7, the connection 31 and superconducting PCS 33. Within and outside the receiving space 3 (see FIG. 1), the inner coil system 1 then generates a magnetic field which is uniform within the measurement space 5. The outer coil system 7 generates a magnetic field which, outside the receiving space 3, opposes the magnetic field of the inner coil system 1, so that the two magnetic fields substantially cancel one another outside the magnet system. Adverse effects of magnetic fields on instruments arranged in the vicinity of the magnet system are thus precluded in known manner. In order to reduce also the effects of external magnetic fields (for example, caused by elevators or passing vehicles), there is provided a superconducting shunt 37 which bridges the inner coil system 1. The shunt 37 is connected between a first connection point 39 and a second connection point 41, which points are situated at a first and a second end, respectively, of the inner coil system. As is disclosed in EP-B-0 299 325, the shunt 37 allows for different currents to flow through the inner and the outer coil system, so that within the inner coil system 1 a compensating magnetic field which counteracts the effects of an external magnetic field to a given extent can be generated.

Figure 3:
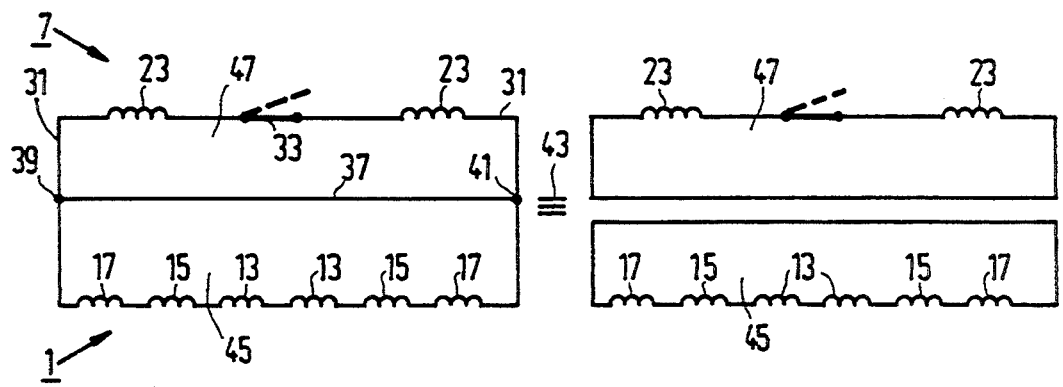
FIG. 3 shows an equivalent diagram of the magnet system shown in FIG. 2.

In order to illustrate the effect of the shunt 37 on the magnetic field within the receiving space 3, the left-hand part of FIG. 3 represents the electrical diagram of FIG. 2 after omission of the power supply apparatus 37, the coil systems 1, 7 being shown in greater detail, whereas the right-hand part shows an equivalent diagram which is the electrical equivalent of the left-hand diagram as denoted by the symbol 43. The left-hand diagram of FIG. 3 shows the coils 13, 15, 17 of the inner coil system 1 and the coils 23 of the outer coil system 7. Because the PCS 33 is in the superconducting state, the shunt 37 bridges not only the coils 13, 15, 17 of the inner coil system 1 but also (via the connection 31 and the PCS 33) the coils 23 of the outer coil system 7. The part of the inner coil system 1 which is directly bridged by the shunt 37 (in this case the assembly of coils 13, 15, 17) thus constitutes, in conjunction with the shunt, a first closed superconducting loop 45 and will be referred to hereinafter as the primary circuit. Similarly, in conjunction with a part of the inner coil system 1 possibly not directly bridged by the shunt 37, the outer coil system 7 forms part of a second closed superconducting loop 47. The latter will be referred to hereinafter as the secondary circuit. The circuit arrangement thus comprises two closed superconducting loops 45 and 47 which constitute a primary circuit and a secondary circuit, respectively, and which may be considered to be separate circuits. Therefore, they are shown as such in the right-hand diagram of FIG. 3. In each of these superconducting loops the magnetic flux remains constant by definition. Consequently, a variation of an external magnetic field, also causing a variation of the magnetic flux enclosed by each of the loops 45, 47, leads to a variation of the current circulating in said loops, said variation causing an opposite flux variation in the loops, so that the net variation of the flux enclosed by the loops equals zero.

Hereinafter, the quantities relating to the primary circuit (the first loop 45 in FIG. 3) will be denoted by an index p and the quantities relating to the secondary circuit (the second loop 47) will be denoted by an index s. The primary and secondary circuits are then defined by the following parameters:

$L_p$: the self inductance of the primary circuit (positive)

$L_s$: the self inductance of the secondary circuit (positive)

$M_{ps}$: the mutual inductance between the primary and the secondary circuit (negative because of the fact that the winding direction of the outer coil system 7 opposes that of the inner coil system 1)

$K_p$: the coil constant of the primary circuit, i.e. the number of Tesla generated at the centre of the measurement space 5 by a current of one ampere in the primary circuit (positive)

$K_s$: the coil constant of the secondary circuit (negative)

$A_p$: the total flux receiving surface of all turns in the primary circuit (positive)

$A_s$: the total flux receiving surface of all turns in the secondary circuit (negative in view of the opposed winding direction of the outer coil system 7).

It is to be noted that the values of the above parameters are dependent on the location of the first and the second connection points 39 and 41. If, as opposed to the FIGS. 2 and 3, these points are not situated at the ends of the inner coil system 1, all said parameters could have different values. It is assumed that a uniform external magnetic field variation occurs whose component along the central axis 9 equals $\Delta B_e$. This corresponds to a flux variation $\Delta B_e A_p$ in the primary circuit and to a flux variation $\Delta B_e A_s$ in the secondary circuit. In order to compensate for these induced flux variations, current variations $\Delta I_p$ and $\Delta I_s$, respectively, occur in the primary and the secondary circuit. The condition that the flux in the loops 45 and 47 should remain constant leads to the equations:

$$A_p \Delta B_e + L_p \Delta I_p + M_{ps} \Delta I_s = 0$$

$$A_s \Delta B_e + L_s \Delta I_s + M_{ps} \Delta I_p = 0$$

It follows therefrom that the current variations induced in the primary and the secondary circuit equal:

$$\Delta I_p = \frac{\Delta B_e (M_{ps} A_s - L_s A_p)}{L_p L_s - M_{ps}^2}$$

$$\Delta I_s = \frac{\Delta B_e (M_{ps} A_p - L_p A_s)}{L_p L_s - M_{ps}^2}$$

The field variation at the centre of the measurement space 5 then becomes:

$$\Delta B = \Delta B_e + K_p \Delta I_p + K_s \Delta I_s$$

The shielding factor s can now be defined as $\Delta B / \Delta B_e$. It follows from the above formulas that:

$$s = 1 - \frac{K_p(L_s A_p - M_{ps} A_s) + K_s(L_p A_s - M_{ps} A_p)}{L_p L_s - M_{ps}^2}$$

This formula is exact. In practice the combination of the inner and outer coil systems 1 and 7 is adapted so that together they do not generate an external magnetic dipole field or only hardly so. In order to achieve this, the coil systems are designed so that the following approximation holds: $-A_p/A_s \approx 1$. Therefore, the formula for s can be simplified by assuming $A_s$ to be equal to $-A_p$:

$$s \approx 1 - A_p \frac{K_p(L_s + M_{ps}) - K_s(L_p + M_{ps})}{L_p L_s - M_{ps}^2} = 1 - C$$

Therein, C is a compensation factor indicating the ratio of a compensating field $B_c$ to the external field $B_e$: $C = B_c / B_e$. The shielding factor $s = 1 - C$ can be positive as well as negative. The lower the absolute value of s, the better the shielding will be. If shielding is perfect, s equals 0. A value of between $-0.05$ and $0.05$ for s means, for example that the field variation at the centre of the measurement space 5 amounts to at the most 5% of an external field variation. Such a value has been found to be acceptable in practice. In that case, therefore, the condition:

$0.95 < C < 1.05$ must be satisfied.

It has been found, however, that these values cannot be readily obtained by means of the construction shown in the FIGS. 2 and 3. An existing magnet system provided with a shunt as shown in FIG. 2, for example, has been found to be characterized, for example by the following values:

$L_p = 55.5$ H  $K_p = 5.22 \times 10^{-3}$ T/A
$L_s = 36.4$ H  $K_s = -2.57 \times 10^{-3}$ T/A
$M_{ps} = -21.3$ H  $A_p = 8200$ m$^2$ This results in a value of $-0.873$ for C, this value is definitely too low.

Figure 4:
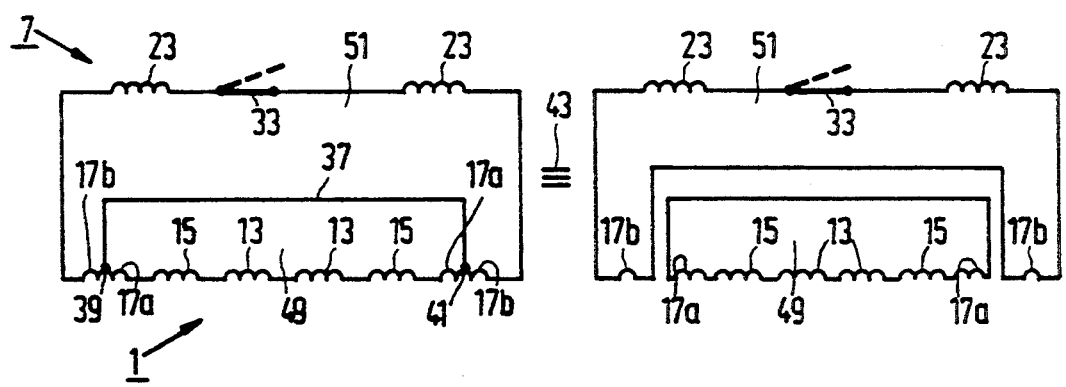
FIG. 4 shows a circuit diagram of a first embodiment of a magnet system in which the steps in accordance with the invention have been taken.

FIG. 4 shows diagrams, corresponding to FIG. 3, of an embodiment of a magnet system in which the steps in accordance with the invention have been carried out. Corresponding parts are denoted by the same reference numerals as used in FIG. 3. The first and second connection points 39 and 41 wherebetween the shunt 37 extends, are situated within the coils 17 of the outer coil pair of the inner coil system 1 in the present embodiment. Consequently, each coil 17 is subdivided into a part 17a which belongs to the first loop 49 (and hence to the primary circuit) and a part 17b which belongs to the second loop 51 (and hence to the secondary circuit). It has been found that the location of the connection points 39, 41 within the coils 17 can be chosen so that the following values are obtained for a magnet system which is for the remainder the same as described above:

$L_p = 29.51$ H $K_p = 4.38 \times 10^{-3}$ T/A
$L_s = 31.81$ H $K_s = -1.72 \times 10^{-3}$ T/A
$M_{ps} = -5.99$ H $A_p = 5874$ m²

For these values, $C = 1.00$. It has been found that, in order to achieve said values, the location of the connection points within the coils 17 should be chosen so that the number of turns between each of the connection points and the extreme outwards end of the relevant coil amounts to approximately 25% of the total number of turns of the relevant coil. The parts 17b, therefore, comprise approximately 25% of the number of turns of the coils 17.

A further improvement can be achieved by mounting more than one shunt. Generally speaking, the mounting of $N-1$ shunts results in the formation of N independent superconducting loops, each of which keeps the enclosed magnetic flux constant. The measurement space 5 is in that case surrounded by various contours with a constant flux, so that the field within the measurement space also remains more or less constant. It is to be expected that the shielding from effects of external magnetic fields is better as the number of shunts (that is to say the number of degrees of freedom of the magnet system) increases. The compensating field $B_c$ then becomes more homogeneous within the measurement space 5. It is also to be expected that an external field gradient in the direction of the central axis 9 is then shielded to a given extent.

The calculation of the shielding effect is in principle the same as described with reference to the FIGS. 2 and 4, be it a more general calculation. When $N-1$ shunts are provided, first the N independent loops have to be identified and their matrix M of mutual inductances calculated. Each element $M_{ij}$ in this matrix represents the mutual inductance between the loops i and j and $M_{ii}$ is a self-inductance. The currents in the N loops are described by a vector I and the mutual inductances with a virtual coil 0 wherethrough a current $I_o$ flows and which represents the external magnetic field $B_c$, by a vector $M_o$. The sustaining of flux is then expressed in matrix notation as:

$$M\Delta I + \Delta I_o M_0 = 0$$

This linear system of equations is to be solved so as to find the current variations $\Delta I$ and hence the magnetic field distribution. Some feasible embodiments of magnet systems comprising more than one shunt are diagrammatically shown in the FIGS. 5 to 8 in which parts corresponding to parts in the preceding Figures are denoted by corresponding references.

Figure 5:
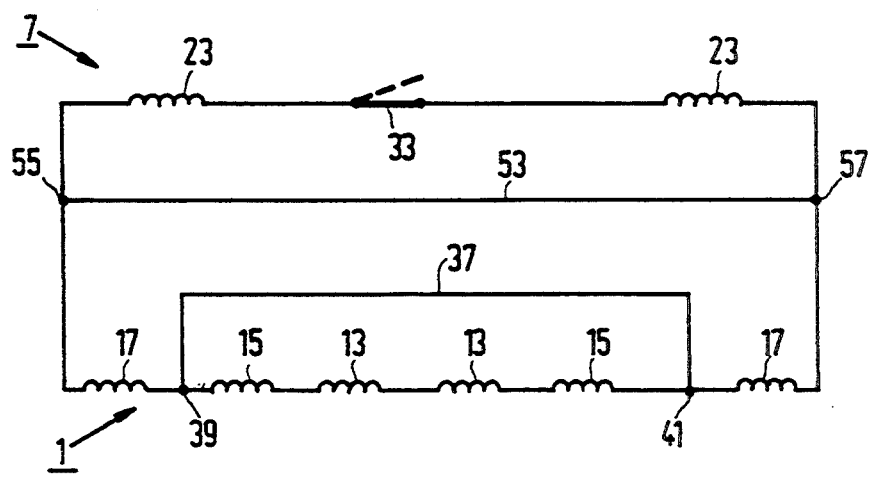
FIGS. 5 to 8 show circuit diagrams of further embodiments.

FIG. 5 shows a magnet system which comprises a second shunt 53 which bridges a part of the magnet system which is situated between a third connection point 55 and a fourth connection point 57. The third and fourth connection points 55 and 57 in the present embodiment are situated at the first end and the second end, respectively, of the inner coil system 1. Between the first connection point 39 and the third connection point 55 there is situated one of the coils 17 forming part of the outer coil pair of the inner coil system 1, and the other coil of this pair is situated between the second connection point 41 and the fourth connection point 57. Because both coils 17 comprise the same number of turns, the number of turns between the first and the third connection point is the same as that between the second and the fourth connection point. Therefore, the construction is symmetrical.

Figure 6:
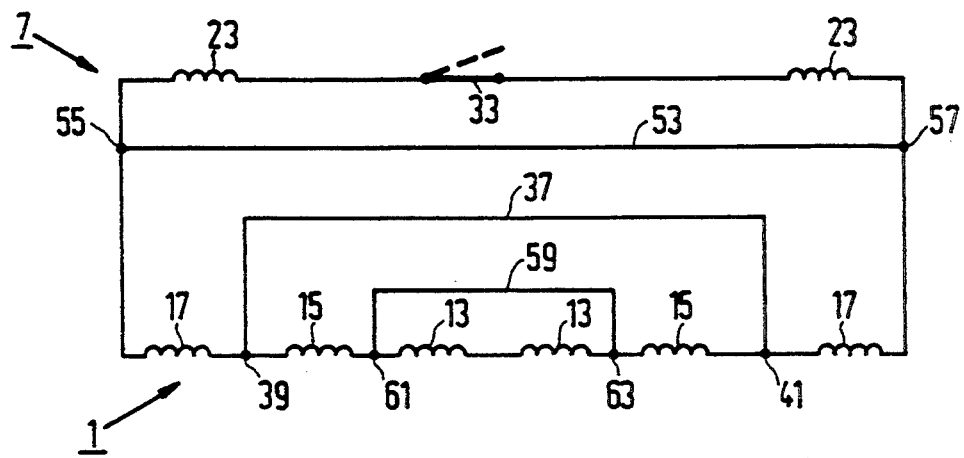

FIG. 6 shows a magnet system comprising three shunts, i.e. a first shunt 37 which extends between first and second connection points 39 and 41, a second shunt 53 between third and fourth connection points 55 and 57, and a third shunt 59 between fifth and sixth connection points 61 and 63. As can be readily seen from the Figure, the construction of this embodiment is symmetrical again.

Figure 7:
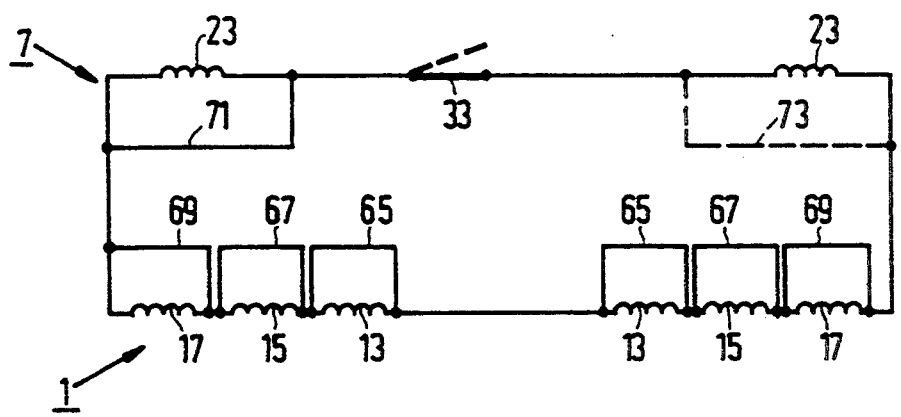

FIG. 7 shows a magnet system in which each coil 13, 15, 17 of the inner coil system 1 is bridged by a shunt. The shunts of the coils 13, 15 and 17 are denoted by the reference numerals 65, 67 and 69, respectively. The connection points, not denoted by reference numerals, are situated at the ends of the relevant coil. Also shown is a shunt 71 which bridges one of the coils 23 (the left-hand coil in FIG. 7) of the outer coil system 7. The other coil 23 is then automatically bridged by the series connection of the shunts 65, 67, 69, 71 and the PCS 33, so that a separate shunt 73 (denoted by a dashed line) for this coil would not increase the number of loops. If the shunt 73 is provided, evidently one of the other shunts can be omitted, all coils of the magnet system still being bridged. Evidently, if desired only a part of the coils of the magnet system can be bridged by means of shunts, for example only the coils 13, 15, 17 of the inner coil system 1 or only the coils 23 of the outer coil system 7.

Figure 8:
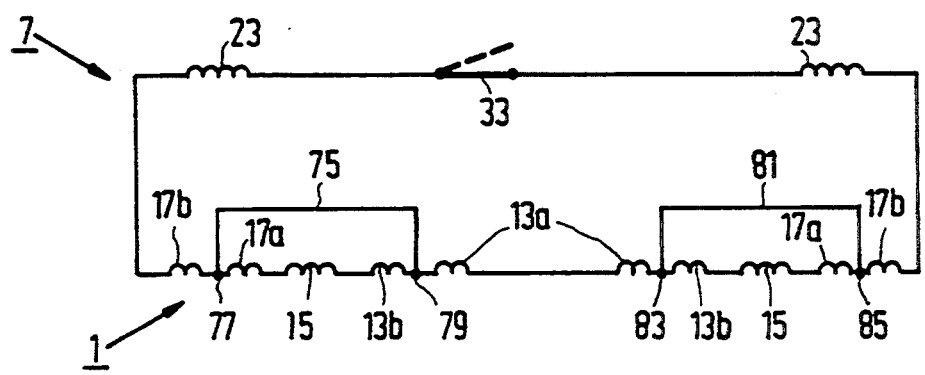

FIG. 8 shows an embodiment of a first shunt 75 which extends between a first connection point 77 and a second connection point 79 and a second shunt 81 which extends between a third connection point 83 and a fourth connection point 85. The first connection point 77 is situated within one of the outer coils 17 (the extreme left-hand coil in FIG. 8) of the inner coil system 1 and the fourth connection point 85 is situated in a corresponding location within the other outer coil 17. The first and fourth connection points 77, 85 thus subdivide the outer coils 17 into parts 17a and 17b in the same manner, so that equal numbers of turns of this coil system are present between each of these connection points and the nearest end of the inner coil system 1. Similarly, the second and third connection points 79 and 83 subdivide a respective one of the coils 13 of the inner coil pair of the inner coil system 1 into two parts 13a and 13b, so that equal numbers of turns of this coil system are also present between each of these connection points and the nearest end of the inner coil system. The locations of the connection points 77, 79, 83 and 85 can be chosen so that the compensating field $B_c$ provides suitable shielding not only in the central part of the measurement space 5, but also in the remainder of the measurement space.

It has been found that the described magnet systems and the obvious alternative versions thereof enable any desired shielding from the effects of external magnetic fields to be achieved. Evidently, the described constructions can also be used for magnet systems in which the inner and/or outer coil systems are constructed in a different way, for example so that they comprise different numbers of coils. A number of these constructions will also shield, to a given extent, gradients of the external fields in the direction of the central axis 9. This is the case, for example for the constructions shown in the FIGS. 7 and 8 where an inhomogeneous external field variation induces currents in the shunts which are unequal to the left and the right of the symmetry plane 11.

It is a property of magnet systems comprising superconducting coils that the magnetic field generated is sustained for a very long period of time without external energy being applied, but after some time a given drift occurs. In practice a magnet system has a time constant of, for example at least $3.6 \times 10^{10}$ s in order to ensure that the decay of the magnetic field does not exceed 0.1 ppm per hour. The drift of the magnetic field induces a current in the loops formed by the coil systems and the shunt (shunts), which current itself generates a weak magnetic field again. Therefore, it may be desirable to introduce a small resistance in the circuit formed by the shunt and the connection points, so that the current induced decreases comparatively quickly. It has been found that a time constant of approximately $10^5$ s or less offers satisfactory results for this circuit. The current in the shielding circuit then decreases much faster than that in the magnet system itself. Even in the steady state (after a few days) the current accumulated in the shielding circuit produces a magnetic field which is so weak that it has no negative effects on the measurement results. Said resistance can be simply built in by a suitable choice of the material used to realize the soldered joints constituting the connection points. A resistance in the order of magnitude of 1 m$\Omega$ has been found to offer satisfactory results. An alternative solution for decreasing the accumulated current is to heat the shunt from time to time so that it briefly enters the normally conductive state.

We claim:

1. A magnetic resonance apparatus comprising:
   a) a magnet system rotationally symmetric about a central axis, said magnetic system comprising:
      i) a superconducting inner coil system having ends and comprising inner coils for generating a steady magnetic field in a measurement space within the magnet system,
      ii) an outer coil system coaxial with the inner coil system and comprising outer coils, said outer coil system being electrically connected in series with the inner coil system in order to shield the environment from the magnetic field generated by the inner coil system,
   b) a superconducting persistent current switch connected across the series connected inner coil system and outer coil system,
   c) a superconducting first shunt which bridges at least part of the magnet system and connected between first and second connection points,
   d) at least one turn of a coil of the magnet system being connected between at least one of the first and second connection points and the nearest end of the inner coil system.

2. A magnetic resonance system as claimed in claim 1, wherein the coil of claim element d) whose at least one turn is connected is a coil of the inner coil system.

3. A magnetic resonance system as claimed in claim 2, wherein said inner coil system has a first and a second end, and the same number of coil turns of the inner coils is connected between the first end of the inner coil system and the first connection point and between the second end of the inner coil system and the second connection point.

4. A magnetic resonance system as claimed in claim 2, wherein the inner coil system comprises plural coil pairs including outer coil pairs symmetrically arranged relative to a central plane extending perpendicularly to the central axis, the first and second connection points being situated such that the number of turns between each of the connection points and the end of an outer coil pair situated furthest outwards from the central plane amounts to approximately 25% of the number of such turns of said coil.

5. A magnetic resonance system as claimed in claim 3, further comprising a second superconducting shunt which bridges a part of the magnet system situated between third and fourth connection points.

6. A magnetic resonance system as claimed in claim 5, wherein the third and fourth connection points are situated at the first and second ends, respectively, of the inner coil system.

7. A magnetic resonance system as claimed in claim 5, wherein an equal number of turns of coils forming part of the inner coil system are situated between the first and third connection points and between the second and fourth connection points.

8. A magnetic resonance system as claimed in claim 5, wherein an equal number of turns of coils forming part of the inner coil system are situated between the first connection point and the first end of the inner coil system and between the fourth connection point and the second end of the inner coil system, and wherein an equal number of turns of coils forming part of the inner coil system are situated between the second connection point and the first end of the inner coil system and between the third connection point and the second end of the inner coil system.

9. A magnetic resonance system as claimed in claim 5, further comprising at least a third superconducting shunt which bridges a part of the magnet system.

10. A magnetic resonance system as claimed in claim 9, wherein the inner coil system comprises first, second and third axially arranged coils, said first, second and third coils being shunted by said first, second and third superconducting shunts, respectively.

11. A magnetic resonance system as claimed in claim 9, wherein the outer coil system comprises first and second axially arranged coils, said first and second coils of said outer coil system being each shunted by one of said first and second superconducting shunts, respectively.

12. A magnetic resonance system as claimed in claim 1, wherein a resistance of the order of magnitude of 1 Megaohms is included in the circuit formed by the shunt and its associated connection point.

13. A magnetic resonance apparatus as claimed in claim 1, characterized in that the locations of the first and second connection points (39, 41) are chosen so that the relation:

$$0.95 < A_p \frac{K_p(L_s + M_{ps}) - K_s(L_p + M_{ps})}{L_p \cdot L_s - M_{ps}^2} < 1.05$$

is satisfied, in which the index p relates to the part of the inner coil system (1) which is to be referred to as the primary circuit and which is bridged by the shunt (37), and the index s relates to the remaining parts of the inner coil system plus the outer coil system (7), together referred to as the secondary circuit, in which $K_p$ and $K_s$ are the coil constants of the primary circuit and the secondary circuit, respectively, $L_p$ and $L_s$ are the self-inductance of the primary and the secondary circuit, respectively, $M_{ps}$ is the mutual inductance between these circuits, and $A_p$ is the total surface area of all turns in the primary circuit.

* * * * *